United States Patent [19]

Nakayama et al.

[11] Patent Number: 4,790,262

[45] Date of Patent: Dec. 13, 1988

[54] THIN-FILM COATING APPARATUS

[75] Inventors: Muneo Nakayama, Tokyo; Akira Uehara, Kanagawa; Hiroyoshi Sago; Hideyuki Mizuki, both of Tokyo, all of Japan

[73] Assignee: Tokyo Denshi Kagaku Co., Ltd., Kanagawa, Japan

[21] Appl. No.: 914,328

[22] Filed: Oct. 1, 1986

[30] Foreign Application Priority Data

Oct. 7, 1985 [JP] Japan .................. 60-153308[U]

[51] Int. Cl.$^4$ .............................................. B05C 11/08
[52] U.S. Cl. ................................. 118/52; 118/50; 118/58; 118/320; 427/240; 427/377; 134/99; 134/153; 269/21
[58] Field of Search ............ 118/50, 52, 54, 56, 118/64, 320, 500, 501; 427/240, 377; 134/99, 153; 269/21

[56] References Cited

U.S. PATENT DOCUMENTS

| 3,791,342 | 2/1974 | Boyer et al. | 118/52 |
|---|---|---|---|
| 3,950,184 | 3/1976 | Adams | 427/240 X |
| 4,037,830 | 7/1977 | Poluzzi et al. | 269/21 |
| 4,113,492 | 9/1978 | Sato et al. | 427/240 X |
| 4,183,545 | 1/1980 | Daly | 269/21 X |
| 4,393,807 | 7/1983 | Fujimura et al. | 427/240 X |
| 4,510,176 | 4/1985 | Cuthbert et al. | 427/240 X |
| 4,518,678 | 5/1985 | Allen | 427/240 X |
| 4,528,934 | 7/1985 | Nakayama | 118/326 X |
| 4,668,334 | 5/1987 | Doornveld | 156/345 X |

FOREIGN PATENT DOCUMENTS

| 0005268 | 1/1977 | Japan | 427/240 |
|---|---|---|---|
| 53-72464 | 6/1978 | Japan | . |
| 0113265 | 9/1979 | Japan | 118/56 |
| 0107032 | 7/1982 | Japan | 118/52 |
| 0114426 | 7/1983 | Japan | 118/50 |
| 0090928 | 5/1984 | Japan | 118/52 |
| 0195827 | 11/1984 | Japan | 118/50 |

OTHER PUBLICATIONS

English Translation to Japanese Kokai Patent Publication No. 59-90928; USPTO, 8-18-87.
J. Holihan, Sr., et al., "Controlled Gap Photoresist Spinning Process", IBM Technical Disclosure Bulletin, vol. 17, No. 11, Apr. 1975, p. 3281.

Primary Examiner—Shrive Beck
Assistant Examiner—Alain Bashore
Attorney, Agent, or Firm—Bogucki, Scherlacher, Mok & Roth

[57] ABSTRACT

A thin-film coating apparatus for coating a thin film on a material includes a casing, a spinner mounted in the casing for rotating the material, and a pipe disposed upwardly of the spinner and having in a lower end thereof a nozzle for dropping a film-forming coating solution onto the material. The casing comprises an annular upper plate, a cylindrical circumferential wall, and a bottom plate. The annular upper plate has defined therein gas flow passages for passage of an inert gas such as an N$_2$ gas introduced from an exterior supply source, and gas ejector holes defined in the upper surface of the annular upper plate in communication with the gas flow passages for ejecting the inert gas toward the pipe.

5 Claims, 2 Drawing Sheets

THIN-FILM COATING APPARATUS

BACKGROUND OF THE INVENTION

1. Field of the Invention

The present invention relates to a thin-film coating apparatus for coating a film-forming coating solution on a surface of a material to be treated such as a semiconductor wafer, a metal plate, a ceramic plate, a printed-circuit board, or a glass plate.

2. Description of the Relevant Art

Apparatus having a spinner for coating a surface of a material such as a semiconductor wafer with a photoresist or a diffusion material are known from Japanese Laid-Open Patent Publication No. 53(1978)-72464 and U.S. Pat. Nos. 3,538,883 and 4,528,934.

In the disclosed coating apparatus, the spinner is disposed in a tubular casing which is open upwardly. When a material to be processed is placed on the upper surface of the spinner, the material is attracted to the upper surface of the spinner under vacuum developed in a vacuum hole. A coating solution is dropped from an upper nozzle onto the material surface. At the same time, the spinner is rotated to rotate the material therewith to spread the dropped coating solution uniformly over the material surface under centrifugal forces.

The coating solution dropped from the nozzle is required to be of uniform nature, e.g., uniform density, for example, at all times. However, the coating solution may change its own properties or characteristics because of its chemical nature. Where the coating solution contains antimony, for example, the coating solution absorbs moisture in an atmosphere or air over the material, changing the properties of antimony.

SUMMARY OF THE INVENTION

It is therefore an object of the present invention to provide a thin-film coating apparatus capable of inactivating the atmosphere between a nozzle for supplying a coating solution and a material to be coated with the coating solution, thereby uniformizing the characteristics of the coating solution in the nozzle.

According to the present invention, there is provided a thin-film coating apparatus for coating a thin film of material in liquid form on a material of a workpiece, comprising a casing having an annular upper plate, a cylindrical circumferential wall, and a bottom plate, the annular upper plate having an upper surface, a spinner operatively mounted in the casing for rotating the material, first means disposed upwardly of the spinner for dropping a film-forming coating solution onto the material, and second means mounted in the annular upper plate for ejecting, from the upper surface of the annular upper plate, an inert gas introduced from an exterior supply source.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
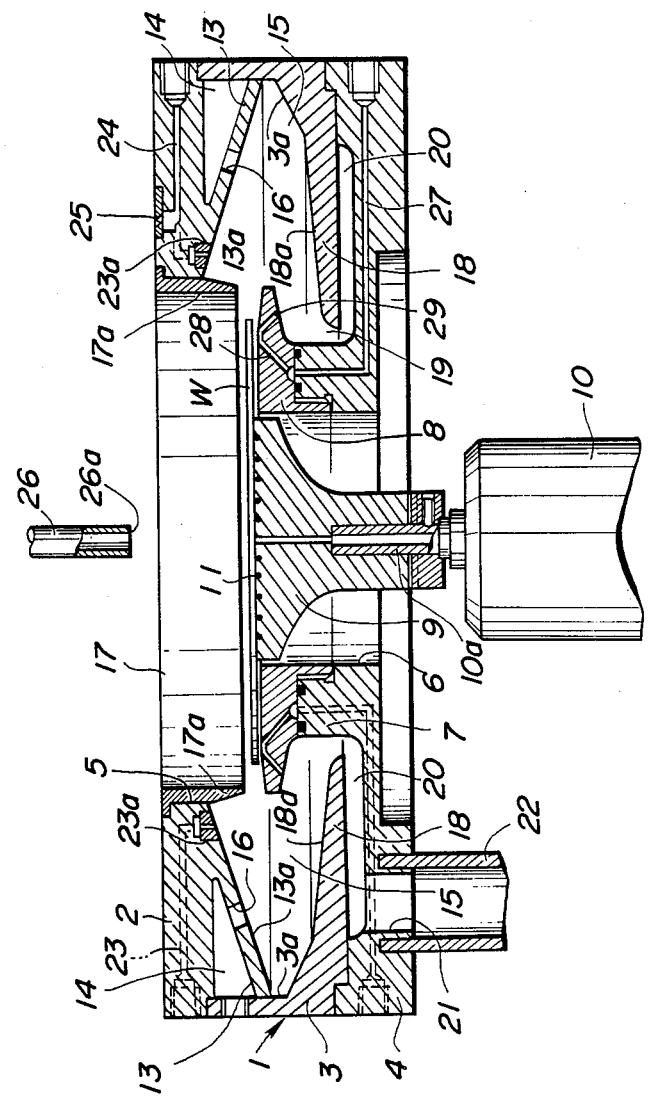
FIG. 1 is a vertical cross-sectional view of a thin-film coating apparatus according to the present invention.
Figure 3:
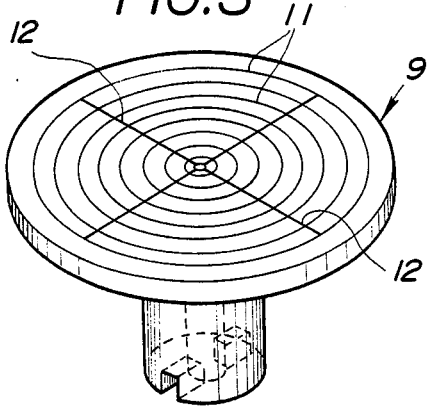
FIG. 3 is a perspective view of a spinner in the thin-film coating apparatus of FIG. 1.

As shown in FIG. 1, a thin-film coating apparatus according to the present invention includes a casing 1 comprising an annular upper plate 2, a cylindrical circumferential wall 3, and a bottom plate 4. The upper and bottom plates 2, 4 have respective central circular holes 5, 6 which are coaxial with each other. The circular hole 6 in the bottom plate 4 is defined by the inner circumferential surface of a cylindrical projection 7 projecting upwardly. A spinner guide 8 is mounted on the top of the cylindrical projection 7. The spinner guide 8 surrounds a space accommodating therein a spinner 9 mounted 24 on an output shaft 10a of a motor 10 and rotatable thereby. The spinner 9 has a larger-diameter upper portion defining in its upper surface a number of concentric circular grooves 11 for developing a vacuum therein and criss-crossing radial grooves 12 interconnecting the grooves 11, as shown in FIG. 3.

A partition wall 13 which extends downwardly in the radially outward direction is joined to the lower surface of the upper plate 2 and has a radially outward edge held in abutment against the cylindrical circumferential wall 3. The partition wall 13, the upper plate 2, and the circumferential wall 3 jointly define a suction passage 14 which communicates through holes 16 with a suction chamber 15 defined radially inwardly of the suction passage 14 and the circumferential wall 3 and downwardly of the partition wall 13. The suction passage 14 is connected to a vacuum pump, not shown.

A ring member 17 is fitted in the circular hole 5 in the upper plate 2. The ring member 17 has a lower portion depending as a skirt portion 17a into the suction chamber 15 to reduce the clearance between the substantially flat upper surface of the spinner guide 8 and the lower end of the ring member 17. The reduced clearance is effective as a suction slot for drawing into the suction chamber 15 a coating solution mist which has been stirred up above a material W on the spinner 9.

The circumferential wall 3 has an integral flanged solvent guide 18 projecting radially inwardly from a lower end thereof in overlying relation to the bottom plate 4. The flanged solvent guide 18 has an upper surface slanted downwardly in the radially inward direction. A solvent inlet slot 19 is defined between the inner circumferential edge of the flanged solvent guide 18 and the outer circumferential surface of the cylindrical projection 7 of the bottom plate 4. The lower surface of the flanged solvent guide 18 and the upper surface of the bottom plate 4 jointly define therebetween a solvent reservoir 20, from which an introduced solvent (including a coating solution) can be recovered through a discharge port 21 and a pipe 22.

Figure 2:
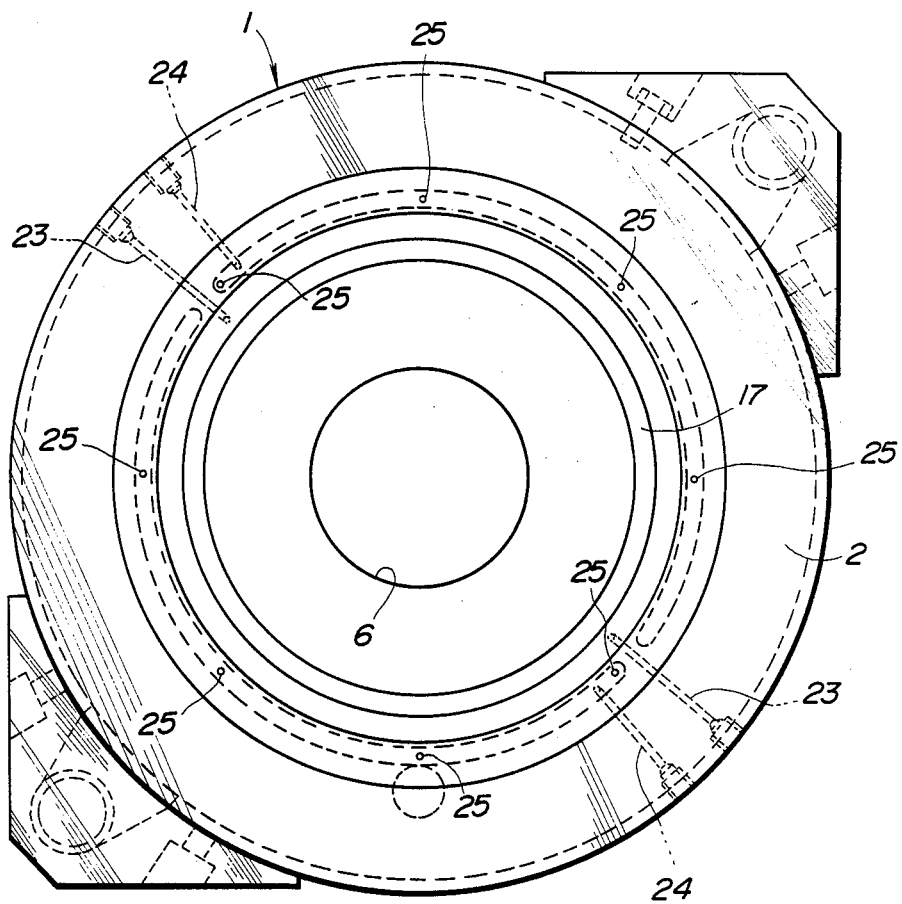
FIG. 2 is a plan view of the thin-film coating apparatus shown in FIG. 1.

As shown in FIGS. 1 and 2, the upper plate 2 has solvent flow passages 23 defined therein and connected to a solvent supply source (not shown) for passage of a solvent therethrough and gas flow passages 24 defined therein and coupled to an inert gas supply source (not shown) of an $N_2$ gas or the like. The solvent flow passages 23 are coupled to nozzles 23a fitted in the partition wall 13 for supplying the solvent from the nozzles 23a on to a lower surface 13a of the partition wall 13. The gas flow passages 24 are connected to a plurality of gas ejector holes 25 opening upwardly at the upper surface of the casing 1. As illustrated in FIG. 2, the gas ejector holes 25 are equally spaced in the circumferential direction and directed toward a pipe 26 having a nozzle 26a on a lower end thereof for dropping a coating solution. Where an atmosphere over the material W firmly held on the spinner 9 contains a high proportion of $N_2$ and the coating solution contains antimony, the gas ejected from the gas ejector holes 25 serves to reduce the moisture in the air to prevent moisture absorption by the coating solution.

The bottom plate 4 also has solvent flow passages 27 coupled to the solvent supply source and communicating with solvent ejector passages 28 defined in the spinner guide 8. The solvent ejected from the solvent ejector passages 28 is effective in removing the coating solution which has flowed onto the lower surface of the material W over its circumferential edge. The solvent then flows through return passages 29 into the solvent reservoir 20.

Operation of the thin-film coating apparatus of the foregoing construction is as follows:

The workpiece material W is placed on the spinner 9 and attracted against the upper surface of the spinner 9 under a vacuum developed in the grooves 11, 12. Then, the coating solution is dropped from the nozzle 26a onto a central portion of the material W. The atmosphere over the material W has a reduced content of moisture because of an inert gas such as an $N_2$ gas ejected from the gas ejector holes 25. Therefore, even if the coating solution contains antimony, it does not absorb much moisture and hence its properties or characteristics remain unchanged.

While the coating solution is dropped onto the material W, the spinner 9 is rotated about its own axis by the motor 10 to rotate the material W therewith. The coating solution on the material W is therefore forced to spread uniformly over the upper surface of the material W under centrifugal forces developed by the rotation of the material W.

Part of the coating solution dropped onto the material W is splashed under centrifugal forces against the inner wall of the suction chamber 15, i.e., the lower surface 13a of the partition wall 13 and the inner surface 3a of the circumferential wall 3. Since the solvent oozing out of the nozzles 23a is flowing down these surfaces 13a, 3a of the suction chamber 15, the splash of the coating solution is dissolved into the solvent on the surfaces 13a, 3a. The solvent then flows from the surfaces 13a, 3a over the upper surface 18a of the flanged solvent guide 18 into the solvent reservoir 20, from which the solvent is discharged through the discharge port 21 and the pipe 22 and recovered.

Part of the dropped coating solution is also scattered as a mist into the suction chamber 15 and above the material W. The scattered coating solution mist in the suction chamber 15 is prevented by the skirt portion 17a of the ring member 17 from streaming back onto the material W. The scattered coating solution mist stirred up above the material W is forcibly drawn into the suction chamber 15 through the small clearance between the upper surface the spinner guide 8 and the lower edge of the skirt portion 17a. The coating solution mist which has been introduced into the suction chamber 15 is then drawn through the holes 16 into the suction passage 14 and discharged out of the suction passage 14. Consequently, the undesired coating solution mist is not deposited again on the surface of the material W.

Although there has been described what is at present considered to be the preferred embodiment of the present invention, it will be understood that the invention may be embodied in other specific forms without departing from the spirit or essential characteristics thereof. The present embodiment is therefore to be considered in all aspects as illustrative, and not restrictive. The scope of the invention is indicated by the appended claims rather than by the foregoing description.

We claim:

1. An apparatus for coating a thin film on a workpiece comprising:
   a casing, including an annular top plate having a circular hole at its center, an annular bottom plate having a circular hole at its center, and a substantially cylindrical wall interconnecting said top and bottom plates;
   a spinner for supporting said workpiece within said casing;
   first means for rotating said spinner;
   second means, disposed upwardly of said spinner, for applying a coating material in liquid form onto the workpiece, said second means including a nozzle from which said coating material in liquid form is ejected; and
   third means for directing an inert gas to said nozzle so as to provide an inert atmosphere between said nozzle and the surface of said workpiece, wherein said third means includes a plurality of inert gas passages defined in said top plate of the casing, each having one end connectable to an external inert gas source, and a plurality of orifices formed at the top surface of said top plate in circumferentially equally spaced relation and in communication with the other end of said gas passages, said inert gas being directed through said orifices to said nozzle.

2. An apparatus according to claim 1, wherein said casing has a suction chamber therewithin, said suction chamber being connectable to an external source of vacuum.

3. An apparatus according to claim 2, wherein said annular top plate of the casing has a plurality of solvent passages connectable to an external source of solvent, and a plurality of solvent nozzles disposed at the lower surface of said annular top plate and respectively connected to the other ends of said solvent flow passages.

4. An apparatus according to claim 3, wherein said bottom plate has a substantially cylindrical center spinner guide extending upwardly from the upper surface thereof to just below said workpiece, and said annular top plate has a substantially cylindrical skirt portion extending downwardly from the lower surface thereof, said spinner guide cooperating with said skirt portion of the annular top plate to provide a small clearance therebetween.

5. An apparatus according to claim 4, wherein said spinner guide has a plurality of solvent passages each having one end connectable to said external solvent source and a plurality of orifices defined at the top surface of said spinner guide and in communication respectively with the other ends of the solvent passages.

* * * * *